United States Patent [19]
Liu et al.

[11] Patent Number: 5,824,457
[45] Date of Patent: Oct. 20, 1998

[54] USE OF WEE (WAFER EDGE EXPOSURE) TO PREVENT POLYIMIDE CONTAMINATION

[75] Inventors: Hsiang Liu; Chien-Ming Chung, both of Hsin-chu; Liang Szuma, Taipei; Ding-Shan Wang, Hsin-Chu, all of Taiwan

[73] Assignee: Taiwan Semiconductor Manufacturing Company, Ltd., Hsin-Chu, Taiwan

[21] Appl. No.: 720,639

[22] Filed: Oct. 2, 1996

[51] Int. Cl.$^6$ .................................................... G03F 7/20
[52] U.S. Cl. ..................... 430/394; 430/311; 430/328; 430/494
[58] Field of Search ................................. 430/311, 328, 430/394, 396, 494

[56] References Cited

U.S. PATENT DOCUMENTS

| | | | |
|---|---|---|---|
| 3,936,301 | 2/1976 | Schneider | 430/311 |
| 4,899,195 | 2/1990 | Gotoh | 355/77 |
| 5,509,974 | 4/1996 | Hays | 148/33.3 |

OTHER PUBLICATIONS

S. Wolf, "Silicon Processing for the VLSI Era" vol. 2, Lattice Press, Sunset Beach, CA, pp. 196, 234, 214–215.

*Primary Examiner*—Kathleen Duda
*Attorney, Agent, or Firm*—George O. Saile; Stephen B. Ackerman

[57] ABSTRACT

A method is disclosed for sealing the edge of a wafer against slurry debris and contaminants that are encountered during grinding and backlapping of a semiconductor substrate. This is accomplished by depositing a photosensitive polyimide as a dielectric material on a wafer and mounting the wafer on a chuck. A light source is introduced above the wafer and close to the edge of the wafer. The chuck is then spun by means of a spindle, thus exposing an outer ring of the circumferential edge of the wafer to light source. Because polyimide behaves like a negative resist in the art of lithography, the exposed ring is fixed in place such that when the wafer is next developed, only the unexposed polyimide corresponding to the scribe line patterns is dissolved forming "scribe channels", while leaving the ring in tact all along the circumference of the wafer. This wafer edge exposure (WEE) then forms an edge, which, in conjunction with a grinding tape, seals the perimeter of the wafer, thus preventing the polishing contaminants from entering the scribe channels.

23 Claims, 3 Drawing Sheets

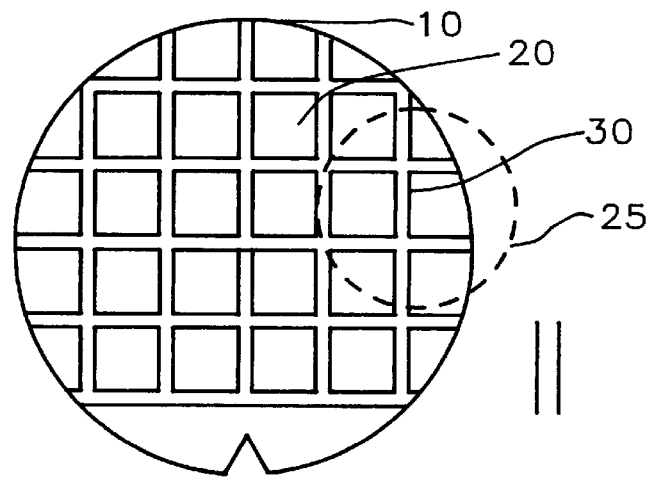
FIG. 1a – Prior Art
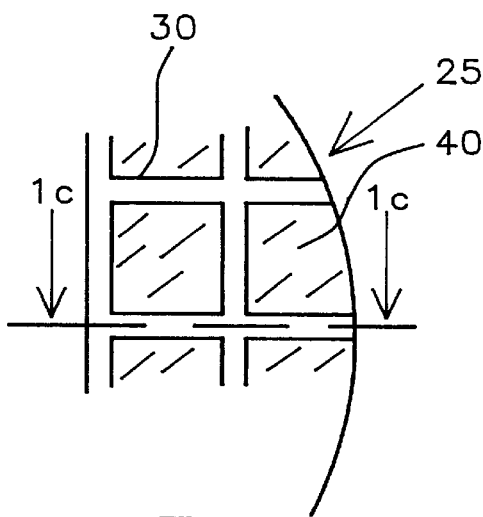
FIG. 1b – Prior Art
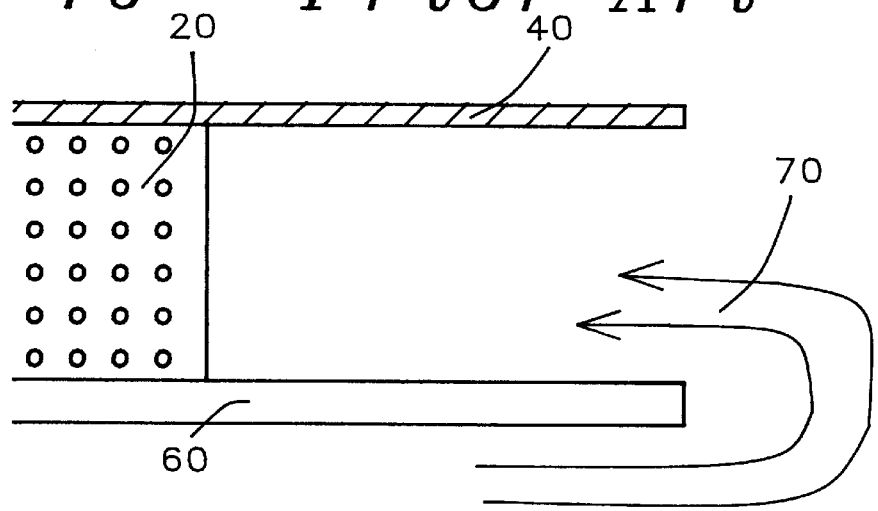
FIG. 1c – Prior Art 5,824,457

USE OF WEE (WAFER EDGE EXPOSURE) TO PREVENT POLYIMIDE CONTAMINATION

BACKGROUND OF THE INVENTION (1) Field of the Invention

The present invention relates generally to interlevel dielectric polishing on semiconductor wafers, and more particularly to a wafer edge seal that limits exposure of polyimide layers to contaminants during polishing.

(2) Description of the Related Art

Polishing of semiconductor wafers is an important part of the total process of manufacturing integrated circuits. Integrated circuits are manufactured on silicon substrates by depositing layers upon layers of different materials, and one after another in a serial fashion within precise specifications. Each conductive layer is separated and insulated from each other by means of interlevel dielectric (ILD) insulating materials. Since each conductive layer consists of features and facets, e.g., metal lines of irregular shapes and dimensions, such features and irregularities manifest themselves as "bumps" or "steps" through the covering interlevel material. When such layers are added on top of one another, steps of progressively higher dimensions are produced. As it will be apparent to those skilled in the art, this is exacerbated even more as the number of levels in the interconnect technology is increased in today's sub-micron technology. The resulting unevenness or the irregular nature of surfaces ultimately lead to reliability problems due to the difficulty of depositing metal on such non-planar surfaces.

There is thus a need to smoothen or planarize the interlevel or ILD surf aces. For this purpose, prior art teaches several different methods of planarization. Some commonly used methods include such techniques as BPSG reflow, planarization with resist, or SOG planarization. In BPSG reflow, a layer of borophophosilcate (BPSG) glass is deposited and then heated to a temperature of greater than 900° C. The heating step causes this material to soften and flow, providing a smoother surface as described, for example, in S. Wolf, "Silicon Processing for the VLSI Era," vol. 2, Lattice Press, Sunset Beach, Calif., 1990, p. 196. However, the temperatures used in this process are too high if aluminum, the most common metallization material, has already been deposited on the wafer. Also, BPSG reflow is most effective for narrow indentations, that is, very small areas of the ILD surface. Broad indentations and spaces in the surface are not made planar, and thus BPSG reflow does not provide for adequate "global" planarization (planarization across the entire wafer surface).

The other technique is planarization with resist or "resist etchback". One drawback to the etchback process is that a thicker ILD film must be deposited than will ultimately remain, since some is removed during the etchback step as described in S. Wolf, "Silicon Processing for the VLSI Era," vol. 2, Lattice Press, Sunset Beach, Calif., 1990, p. 234. Also, this technique requires more process steps in addition to typically requiring that the dielectric and resist have similar etch rates, which is difficult to accomplish and control.

In the SOG planarization process, the method requires the curing of spin-on-glass (SOG) layer, which converts the SOG to silicon dioxide. However, contaminants result when the structure is heated to greater than 300° C., which evolve and corrode the aluminum vias.

To overcome some of the problems cited above, an improved planarization method known as chemical/mechanical polishing, or CMP, has been introduced. Here, a semiconductor wafer is held and rotated against a polishing surface, on which there is a polishing slurry containing abrasive material such as alumina or silica. At the same time, a chemical etchant may be introduced so that material is removed from the wafer by both chemical and mechanical means.

However, the mechanical polishing aspects of CMP is not much different from the common grinding and polishing techniques of similar processes using rotating machine heads, pads and abrasive slurries to polish glass and raw silicon wafers. Mechanical polishing introduces particle contaminants, and in the case of CMP where the slurry consists of hard to clean chemical solutions, contamination problem becomes even more acute. The problem is further compounded when polyimide is used as the interlevel dielectric.

As is well known in the art, polyimide films have some times been preferred as interlevel dielectrics because, as enumerated in S. Wolf, "Silicon Processing for the VLSI Era," vol. 2, Lattice Press, Sunset Beach, Calif., 1990, pp. 214–215, they have the various attractive properties such as: a) they produce surfaces in which the step heights of underlying features are reduced, and step slopes are gentle and smooth, b) the films are free of pinholes and cracks, and c) the process used to deposit and pattern the polyimide films is relatively simple, and less expensive compared to other alternatives. These advantages, however, are mitigated unless the following manufacturing-compatibility and reliability concerns are addressed: a) polyimide is hygroscopic (i.e., it readily absorbs water). Thus, if a wide metal line covers a portion of the polyimide film, the moisture under the metal film will attempt to escape the surface covered by the metal, which can lead to bubbling of the metal film, and b) the absorbed moisture can potentially cause corrosion of underlying metal lines. It will be appreciated by those skilled in the art, therefore, that when polishing a polyimide interlevel dielectric, the moisture content of the slurries used during polishing will lead to reliability problems unless preventive measures are taken to keep the slurry contaminants away from metal layers that are embedded within the polyimide layers.

In the prior art of polishing, slurry contaminants readily encroach upon layer structures as readily explained by referring to FIGS. 1a–1c. In FIG. 1a a plan view of a wafer (10) is shown. The wafer in the same figure has been subjected to many different process steps by methods well known in the art and as they are not significant to the invention, will not be described in detail here. The deposition of the various interlevel layers are also well known in the art and, therefore, are not described here in order not to unnecessarily obscure the present invention. It is sufficient to note from FIG. 1c that wafer (10) is comprised of substrate (60) and devices therein not shown, as well as metal layers also not shown but separated by means of interlevel dielectric the last one of which is polyimide layer (20) whose partial cross-section at 1c—1c is shown in the same FIG. 1c.

The polyimide layer on chip sites (20), which is also shown in the plan view of FIG. 1a, is patterned into scribe lines (30) by means of conventional lithographic processes. The scribe lines delineate chip sites, as will be well known to those who practice the art. Thus, the scribe lines form channels within the body of the interlevel dielectric (20), which are better seen in the enlarged plan view of FIG. 1b. The area in FIG. 1b corresponds to region (25) shown in FIG. 1a. Now, in order to further lap, or polish the back, or bottom side of substrate (60) prior to the final planarization of the dielectric layer on top, a grinding tape (40) is applied to the top side of the wafer. Again, tape (40) is better visualized in the cross-sectional view in FIG. 1b and is not shown in FIG. 1a for clarity.

In a typical polishing process of the back side of substrate (60), the taped top side (40) is held on a rotating carrier which in turn is held against a rotating polishing pad coated with a polishing slurry. Inasmuch as the scribe lines are relatively deep on the order of 5 micrometers, it has been observed in the present state of the manufacturing line that tape (40) cannot completely fill and seal the channels to prevent the polishing slurry (70) from entering the channels, and thereby causing the contamination of the polyimide layer (20). What is needed, therefore, is a method by means of which polishing contaminants can be kept away from reaching the polyimide layer on the wafer. Prior art does not address this need in polishing wafers. For example, U.S. Pat. No. 5,509,974 discloses only an etch control seal for dissolved wafer process. This is accomplished by bonding selected raised areas on a semiconductor substrate to a second substrate, hence forming trenches which in turn prevent the etchant solution to contact microstructures which are on the other side of the trench. However, this technique has the disadvantage of not being applicable to interlevel layers such as polyimides.

SUMMARY OF THE INVENTION

It is therefore an object of this invention to provide a method of sealing the edge of wafers in order to prevent contaminants from reaching the polyimide layers during polishing of the same.

It is another object of this invention to provide a method for improving the yield on wafer polishing by sealing the edge of wafers.

These objectives are accomplished by depositing a photosensitive polyimide as a dielectric material on a wafer and mounting the wafer on a chuck. A light source is introduced above the wafer and close to the edge of the wafer. The chuck is then spun by means of a spindle, thus exposing an outer ring of the circumferential edge of the wafer to light source. Because polyimide behaves like a negative resist in the art of lithography, the exposed ring is fixed in place such that when the wafer is next developed, only the unexposed polyimide corresponding to the scribe line patterns is dissolved while leaving the ring in tact all along the circumference of the wafer. This ring then forms an edge seal on the perimeter of the wafer, thus preventing the polishing contaminants from entering the scribe channels.

BRIEF DESCRIPTION OF THE DRAWINGS

FIG. 1a is a plan view of a wafer of prior art showing scribe lines and chip sites.

FIG. 1b is an enlarged view of a portion of FIG. 1a of prior art.

FIG. 1c is a cross-section of a portion of FIG. 1b, showing how polishing contaminants enter into scribe line channels formed on a prior art wafer.

DESCRIPTION OF THE PREFERRED EMBODIMENTS

Figure 2A:
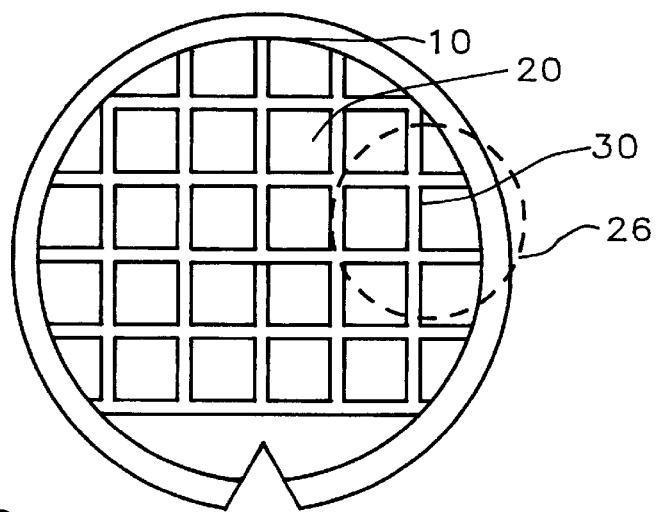
FIG. 2a is a plan view of a wafer having an edge seal according to the present invention.
Figure 2B:
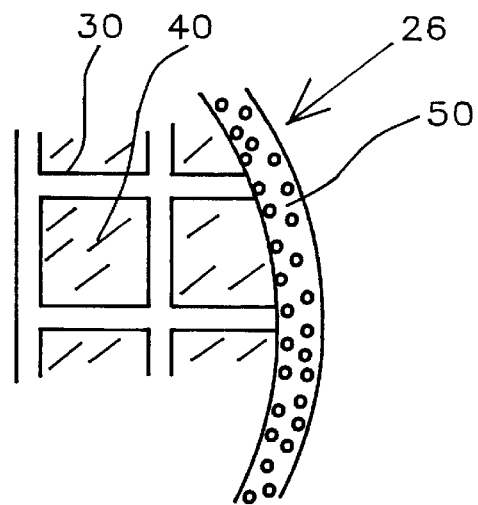
FIG. 2b is an enlarged view of a portion of FIG. 2a of the present invention.
Figure 2C:
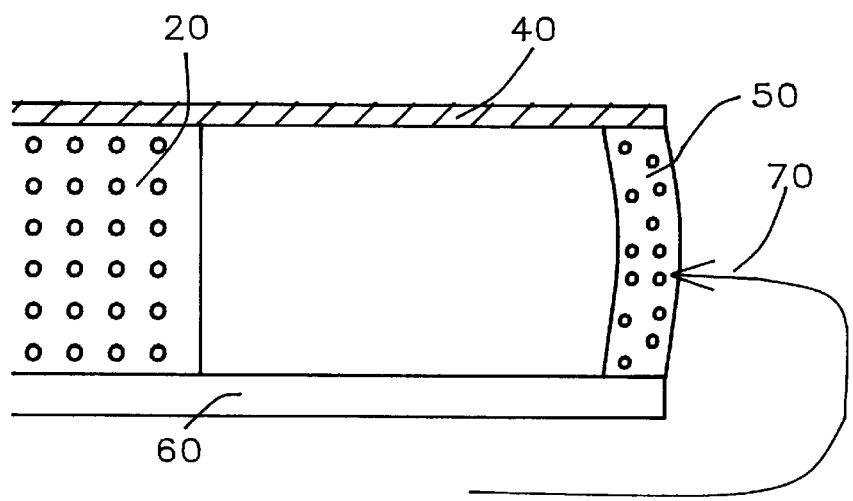
FIG. 2c is a cross-section of a portion of FIG. 2b, showing how polishing contaminants are blocked from entering into channels formed on wafer having an edge seal of the present invention.
Figure 3:
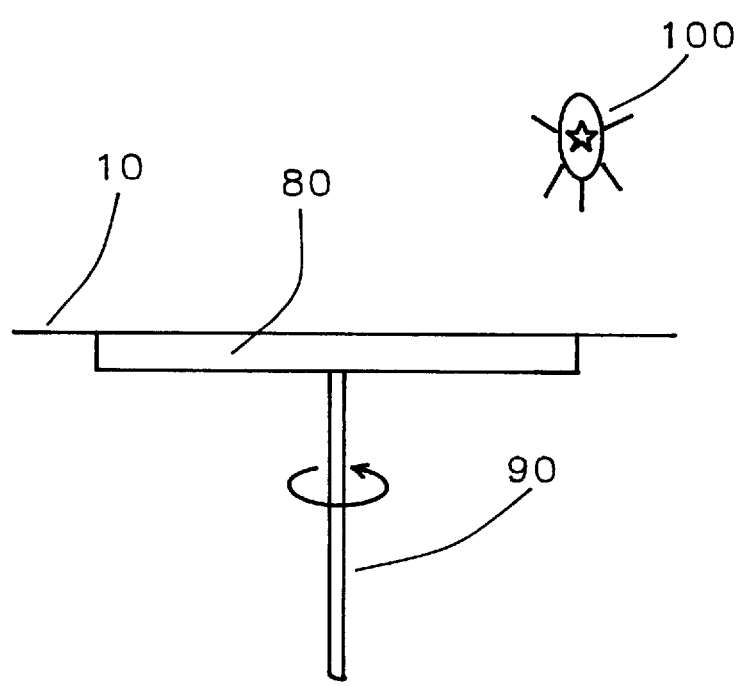
FIG. 3 is a set-up showing wafer edge exposure on a spinning chuck according to the present invention.

Referring now to the drawings, in particular to FIGS. 2a, 2b and 2c, there are shown a plan view, an enlarged portion, and a cross-sectional view of a wafer, respectively, according to this invention. Wafer (10) in FIG. 2a has been subjected to many different process steps by methods well known in the art, including the spinning of the top dielectric to a thickness of between about 4 to 6 micrometers. In the preferred embodiment, the top dielectric is a photosensitive polyimide which serves as a passivation layer. Prior to developing the polyimide to form the scribe lines (30) shown in FIG. 2a, wafer (10) is first mounted on a chuck (80) on a spindle (90) as shown in FIG. 3. Directly above the edge of wafer (10) is an ultra-violet (UV) light source (100) . It is preferred that the UV light be located at a height of between about 0.05 cm to 0.1 cm above wafer (10) and in line with the edge of the wafer. To obtain maximum intensity, high power mercury-arc lamp is preferred at about 200 watts. Furthermore, using the mid-UV range, filters are preferred to allow the I-line spectrum and effectively block light wavelengths shorter than 300 nanometers (nm) in order to make the polyimide fix properly.

Wafer (10) in FIG. 3 is rotated on spindle (90) at a rate of 1.5 revolutions per minute while being exposed to light source (100) for about 40 to seconds. On the polyimide layer around the circumference of wafer (10) a ring of width of between about 1000 to 3000 micrometers is thus fixed by exposure to light (100). This ring is shown as item (50) in FIG. 2a and is better seen in the enlarged view (26) in FIG. 2b. Thus, when grinding tape (40) is next applied on to wafer surface that has already been processed for the scribe lines (30), it is clear from FIG. 2c that ring (50) forms a continues seal along the circumference of the wafer against any polishing debris and contaminants (70) that may want to enter the already existing scribe channels during back lapping of substrate (60).

It will be appreciated by those skilled in the art that in this preferred mode, the exposure of the circumferential ring is accomplished by simply rotating the wafer under a light source lined up with the edge of the wafer without the need for a mask to accomplish the same. Thus, in an alternate embodiment, wafer edge exposure can be accomplished at the same time that the chip sites are exposed and fixed by incorporating into the mask for the scribe lines a pattern corresponding to the circumferential ring. During the subsequent development process of the polyimide, the unexposed areas for the scribe lines would be dissolved while the chip sites and ring area that are exposed would remain fixed. The preferred development process is performed with a developer of cyclopentanone base.

While the invention has been particularly shown and described with reference to the embodiments cited above, it will be understood by those skilled in the art that various changes in form and details may be made without departing from the spirit and scope of the invention.

What is claimed is:

1. A method for sealing the edge of a wafer comprising the steps of:

providing a wafer;

providing an interlevel dielectric on said wafer;

mounting said wafer on a rotatable chuck;

exposing the edge of said wafer on said rotatable chuck to a first light source;

exposing said wafer to a second light source through a mask;

developing said wafer; and forming a wafer edge exposure (WEE) seal.

2. The method of claim 1, wherein said wafer is comprised of a semiconductor substrate.

3. The method of claim 1, wherein said interlevel dielectric is a photosensitive polyimide.

4. The method of claim 1, wherein said rotatable chuck is connected to a spindle.

5. The method of claim 4, wherein said spindle is rotated at about 1.5 revolutions/min.

6. The method of claim 1, wherein said first light source is an arc lamp.

7. The method of claim 6, wherein said arc lamp transmits ultra-violet wavelength of between about 300 to 500 nanometers (nm).

8. The method of claim 6, wherein said arc lamp has a power of about 200 watts.

9. The method of claim 1, wherein said exposing of said edge of said wafer on said chuck is for a duration of about 40 seconds.

10. The method of claim 9, wherein said wafer edge is a circumferential ring of width between about 1000 to 3000 micrometers.

11. The method of claim 1, wherein said second light source transmits ultra-violet wavelength of between about 300 to 500 nm.

12. The method of claim 11, wherein said second light source has a power of about 200 watts.

13. The method of claim 1, wherein said mask contains patterns of scribe lines.

14. The method of claim 1, wherein said developing is accomplished by means of a developer of cyclopentanone base.

15. The method of claim 1, wherein said WEE seal is formed by said edge and a grinding tape used in polishing said wafer.

16. A method for sealing the edge of a wafer comprising the steps of:

providing a wafer;

providing an interlevel dielectric on said wafer;

exposing said wafer to a light source through a mask;

developing said wafer; and forming a wafer edge seal.

17. The method of claim 16, wherein said wafer is comprised of a semiconductor substrate.

18. The method of claim 16, wherein said interlevel dielectric is a photosensitive polyimide.

19. The method of claim 16, wherein said light source transmits ultra-violet wavelength of between about 300 to 500 nm.

20. The method of claim 19, wherein said light source has a power of about 200 watts.

21. The method of claim 16, wherein said mask contains patterns of scribe lines and a circumferential ring.

22. The method of claim 16, wherein said developing is accomplished by means of a developer of cyclopentanone base.

23. The method of claim 16, wherein said wafer edge seal is formed by said edge and a grinding tape used in polishing said wafer.

* * * * *